(12) United States Patent
Yu et al.

(10) Patent No.: US 9,401,416 B2
(45) Date of Patent: Jul. 26, 2016

(54) METHOD FOR REDUCING GATE HEIGHT VARIATION DUE TO OVERLAPPING MASKS

(71) Applicant: GLOBALFOUNDRIES Inc., Grand Cayman (KY)

(72) Inventors: Hong Yu, Rexford, NY (US); Jin Ping Liu, Ballston Lake, NY (US); Haigou Huang, Rexford, NY (US); Huang Liu, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/560,035

(22) Filed: Dec. 4, 2014

(65) Prior Publication Data

US 2016/0163830 A1 Jun. 9, 2016

(51) Int. Cl.
*H01L 21/768* (2006.01)
*H01L 29/66* (2006.01)
*H01L 21/02* (2006.01)
*H01L 21/3105* (2006.01)

(52) U.S. Cl.
CPC ...... *H01L 29/66795* (2013.01); *H01L 21/0223* (2013.01); *H01L 21/31051* (2013.01); *H01L 29/6656* (2013.01); *H01L 29/66545* (2013.01); *H01L 29/66636* (2013.01)

(58) Field of Classification Search
CPC ............... H01L 29/66545; H01L 21/823814; H01L 29/495; H01L 29/4966; H01L 29/517
See application file for complete search history.

(56) References Cited

U.S. PATENT DOCUMENTS

| 6,465,290 B1* | 10/2002 | Suguro | H01L 29/66545 257/407 |
| 9,190,272 B1* | 11/2015 | Park | H01L 29/517 |
| 2005/0019993 A1* | 1/2005 | Lee | H01L 21/84 438/157 |
| 2010/0062577 A1* | 3/2010 | Liao | H01L 21/823412 438/301 |
| 2011/0049645 A1* | 3/2011 | Chang | H01L 21/28247 257/410 |
| 2011/0303951 A1* | 12/2011 | Zhu | H01L 29/045 257/192 |
| 2012/0070995 A1* | 3/2012 | Wang | H01L 21/823842 438/705 |
| 2012/0104498 A1* | 5/2012 | Majumdar | H01L 29/66545 257/351 |
| 2012/0315732 A1* | 12/2012 | Kang | H01L 21/845 438/197 |
| 2014/0027783 A1* | 1/2014 | Yin | H01L 21/823431 257/77 |
| 2014/0312398 A1* | 10/2014 | Ching | H01L 29/66795 257/288 |
| 2014/0335673 A1* | 11/2014 | Kim | H01L 29/66545 438/283 |
| 2014/0361353 A1* | 12/2014 | Yin | H01L 21/28114 257/288 |
| 2015/0129952 A1* | 5/2015 | Chuang | H01L 27/11568 257/326 |
| 2015/0206891 A1* | 7/2015 | Chuang | H01L 27/11573 257/325 |
| 2015/0262876 A1* | 9/2015 | Yang | H01L 21/76897 257/401 |
| 2015/0380514 A1* | 12/2015 | Bentley | H01L 29/6656 257/346 |

* cited by examiner

*Primary Examiner* — Jaehwan Oh
(74) *Attorney, Agent, or Firm* — Amerson Law Firm, PLLC

(57) ABSTRACT

A method includes forming at least one fin in a semiconductor substrate. A placeholder gate structure is formed above the fin. The placeholder gate structure includes a placeholder material and a cap structure defined on a top surface of the placeholder material. The cap structure includes a first cap layer disposed above the placeholder material and a second cap layer disposed above the first cap layer. An oxidization process is performed on at least a portion of the second cap layer to form an oxidized region above a remaining portion of the second cap layer. A portion of the oxidized region is removed to expose the remaining portion. The remaining portion of the second cap layer is removed. The first cap layer is removed to expose the placeholder material. The placeholder material is replaced with a conductive material.

21 Claims, 7 Drawing Sheets

METHOD FOR REDUCING GATE HEIGHT VARIATION DUE TO OVERLAPPING MASKS

BACKGROUND OF THE INVENTION

1. Field of the Invention

The present disclosure generally relates to the fabrication of semiconductor devices, and, more particularly, to a method for reducing gate height variation due to overlapping masks.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered, and irrespective of whether it is a planar or 3D finFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called finFET device has a three-dimensional (3D) structure. FIG. 1A is a perspective view of an illustrative prior art finFET semiconductor device 100 that is formed above a semiconductor substrate 105. In this example, the finFET device 100 includes two illustrative fins 110, 112, a placeholder gate structure 115 (e.g., polysilicon with an underlying gate insulation layer (not shown)), sidewall spacers 120 (e.g., silicon nitride), and a gate cap 125 (e.g., silicon nitride). When employing a gate replacement fabrication technique, the placeholder gate structure 115 is subsequently replaced with a high-k gate insulation layer and one or more metal materials to serve as a gate electrode for the device. The fins 110, 112 have a three-dimensional configuration. The portions of the fins 110, 112 covered by the gate structure 115 define channel regions for transistor devices. An isolation structure 130 is formed between the fins 110, 112.

As illustrated in FIG. 1B, in a conventional process flow, the portions of the fins 110, 112 that are positioned outside of the spacers 120, i.e., in the source/drain regions of the device 100, may be increased in size by performing one or more epitaxial growth processes to form epitaxial semiconductor material 135 on the fin 110 and epitaxial semiconductor material 140 on the fin 112. The process of increasing the size of the fins 110, 112 in the source/drain regions of the device 100 is performed to reduce the resistance of source/drain regions and/or make it easier to establish electrical contact to the source/drain regions.

In some devices, such as memory devices, the fin 110 is associated with an N-type transistor device, and the fin 112 is associated with a P-type transistor device, while the gate structure 115 is shared by the devices. The type of epitaxial semiconductor material 135, 140 employed is different for the different types of transistor devices. Typically, a first mask is used to cover the fin 112 while the epitaxial semiconductor material 135 is grown. The first mask is removed and a second mask is employed to cover the epitaxial semiconductor material 135 to allow the epitaxial semiconductor material 140 to be grown on the fin 112. Due to the etch processes for removing the masks and imperfect alignment, a bump feature 145 is typically formed in an overlap region at the boundaries of the first and second masks. This bump feature 145 may be formed from remnants of the masks and from material loss in the cap layer 125.

FIG. 1C illustrates a cross-sectional view of the finFET device 100 and a second finFET device 150 in a different region of the integrated circuit product. The cross-sectional view of FIG. 1C is taken through the fin in the gate length direction of the two transistor devices 100, 150. The device 100 includes transistor devices having different types with a shared gate structure 115. Due to the overlapping masks employed to grow the different epitaxial materials on the fins of differing conductivity types, a bump feature 145 is present above the gate structure 115 of the device 100. In contrast, the device 150 represents a device with fins associated with transistor devices having the same conductivity type, so overlapping masks are not used and no bump feature 145 is present.

In a gate replacement technique, a planarizing process is employed to expose the placeholder gate structures 115 of both devices 100, 150 so that they can be removed and replaced with a conductive material, such as metal. Due to the absence of a bump feature 145 on the device 150, the polishing process exposes the placeholder structure 115 more quickly, resulting in dishing of the device 150 and a lower gate height as compared to the device 100, as illustrated in FIG. 1D. A similar disparity can arise in regions with different device densities, and as a result different bump densities. The region with a lower bump density is planarized more aggressively and more quickly than the region with higher bump density, so more dishing occurs and the gate height is comparatively reduced. In some instances, due to the bump height differences, the placeholder structure 115 may be incompletely exposed, resulting in the formation of defects during the gate replacement process.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things. forming at least one fin in a semiconductor substrate. A placeholder gate structure is formed above the fin. The placeholder gate structure includes a placeholder material and a cap structure defined on a top surface of the placeholder material. The cap structure includes a first cap layer disposed above the placeholder material and a second cap layer disposed above the first cap layer. An oxidization process is performed on at least a portion of the second cap layer to form an oxidized region above a remaining portion of the second cap layer. A portion of the oxidized region is removed to expose the remaining portion. The remaining portion of the second cap layer is removed. The first cap layer is removed to expose the placeholder material. The placeholder material is replaced with a conductive material.

Another method includes, among other things, forming at least one fin in a semiconductor substrate. A placeholder material layer is formed above the fin and the substrate. A first cap later is formed above the placeholder material layer. A second cap layer is formed above the first cap layer. The placeholder material layer, the first cap layer, and the second cap layer are patterned to define a placeholder gate structure. The second cap layer is removed selectively to the first cap layer. The first cap layer is removed to expose the placeholder material. The placeholder material is replaced with a conductive material.

Yet another method includes, among other things, forming at least one fin in a semiconductor substrate. A placeholder gate structure is formed above the fin. The placeholder gate structure includes a placeholder material and a cap structure defined on a top surface of the placeholder material. The cap structure includes a first cap layer disposed above the placeholder material and a second cap layer disposed above the first cap layer. A first interlayer dielectric layer is formed covering a first portion of the placeholder gate structure and exposing a second portion of the placeholder gate structure. The second portion of the placeholder gate structure includes the cap structure. An oxidization process is performed on at least a portion of the second cap layer to form an oxidized region above a remaining portion of the second cap layer. A second interlayer dielectric layer is formed above the first interlayer dielectric layer and above the cap structure. The second interlayer dielectric layer is planarized to expose the remaining portion of the second cap layer. The remaining portion of the second cap layer is removed. The second interlayer dielectric layer is planarized to remove the first cap layer and expose the placeholder material. The placeholder material is replaced with a conductive material.

BRIEF DESCRIPTION OF THE DRAWINGS

The disclosure may be understood by reference to the following description taken in conjunction with the accompanying drawings, in which like reference numerals identify like elements, and in which.

Figure 1A:
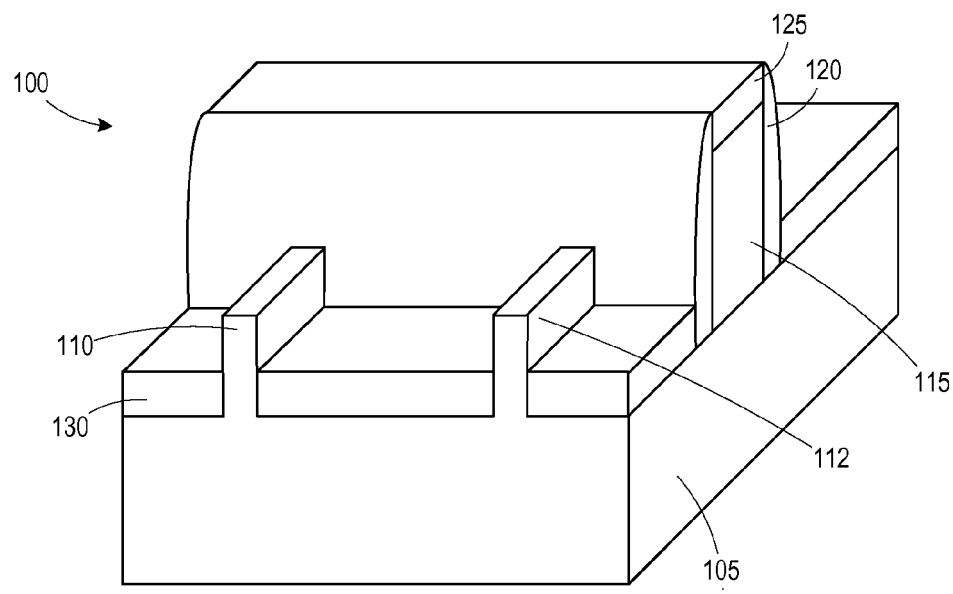
FIGS. 1A-1D schematically depict an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a transistor device. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
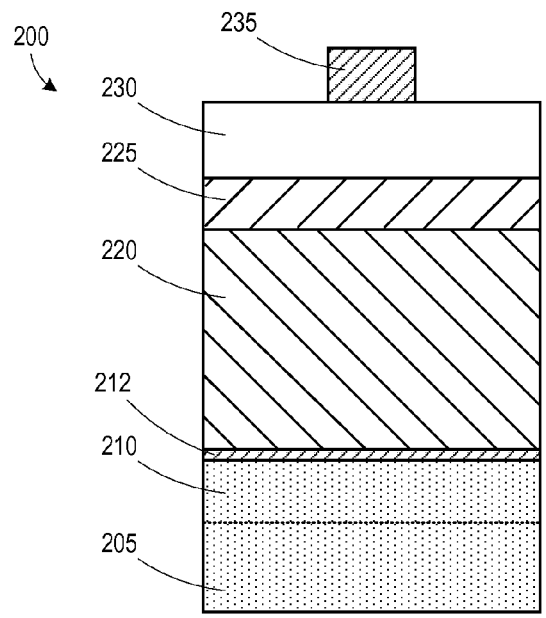
FIGS. 2A-2Q depict various methods disclosed herein of forming a finFET device.
Figure 2B:
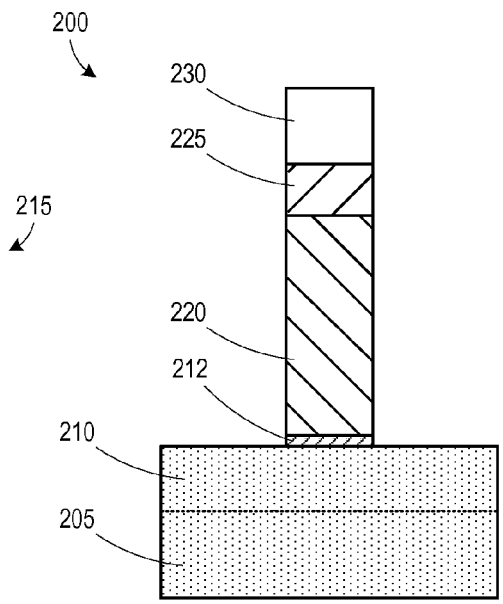
Figure 2C:
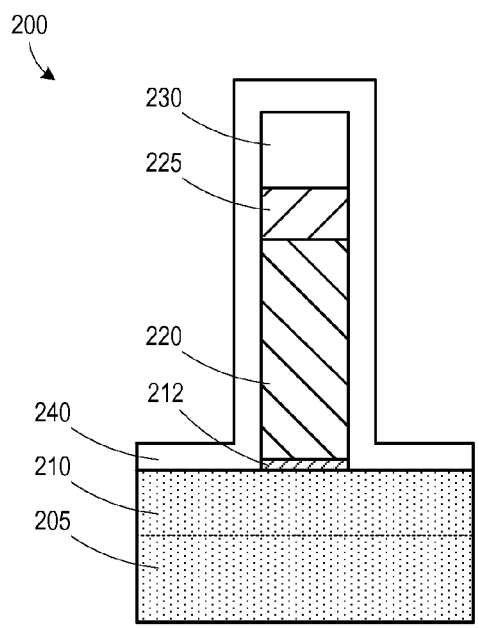
Figure 2D:
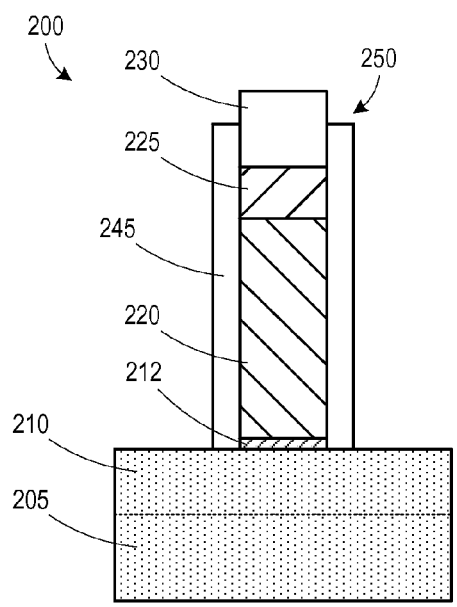
Figure 2E:
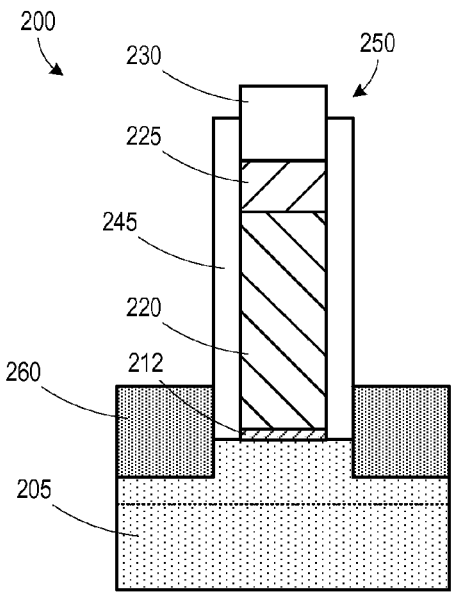
Figure 2F:
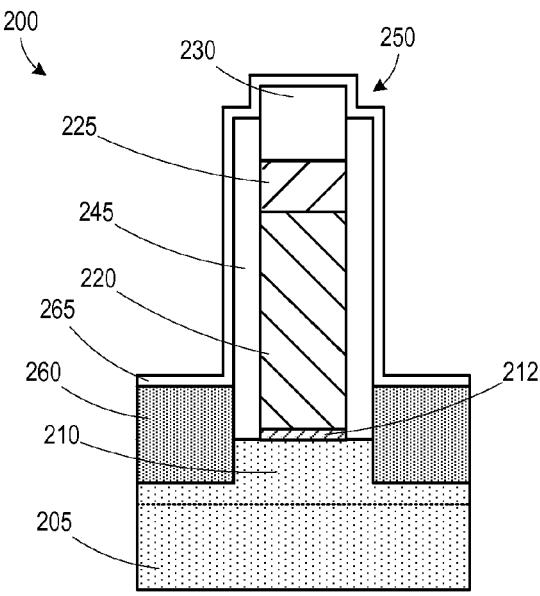
Figure 2G:
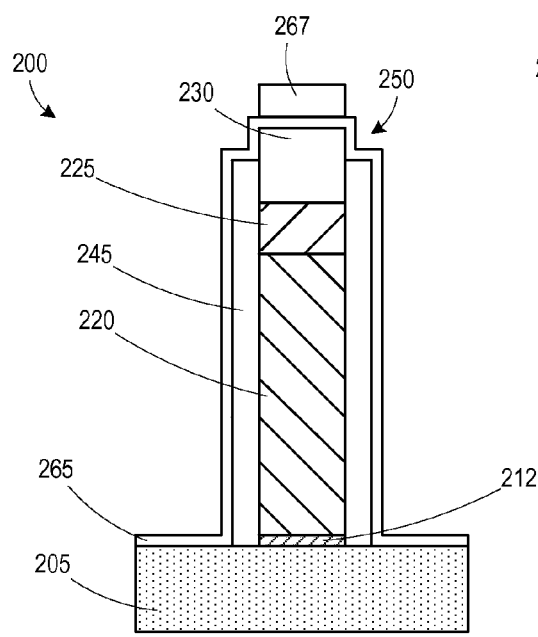
Figure 2H:
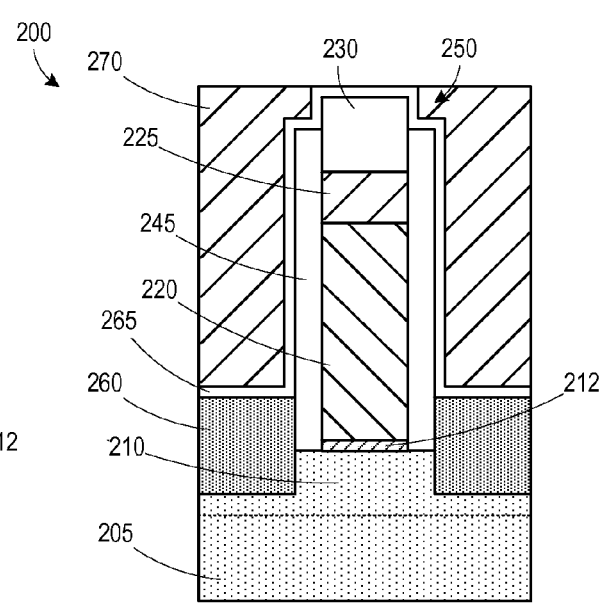
Figure 2I:
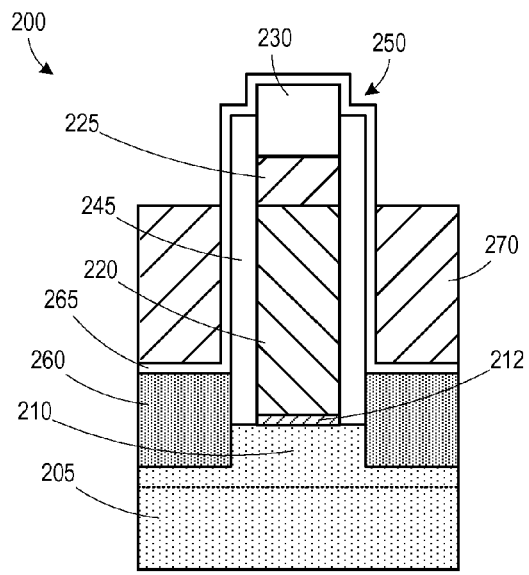
Figure 2J:
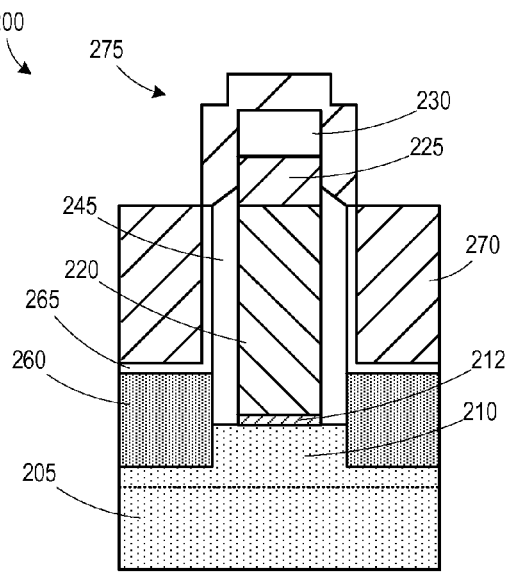
Figure 2K:
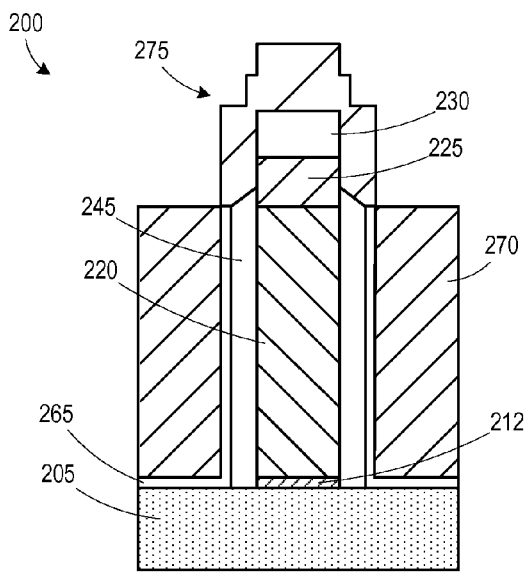
Figure 2L:
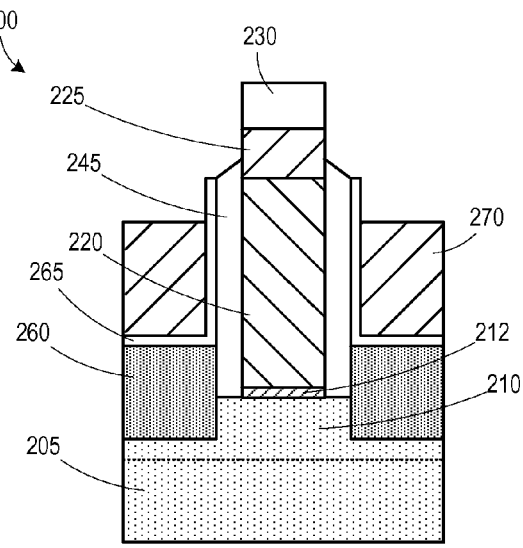
Figure 2M:
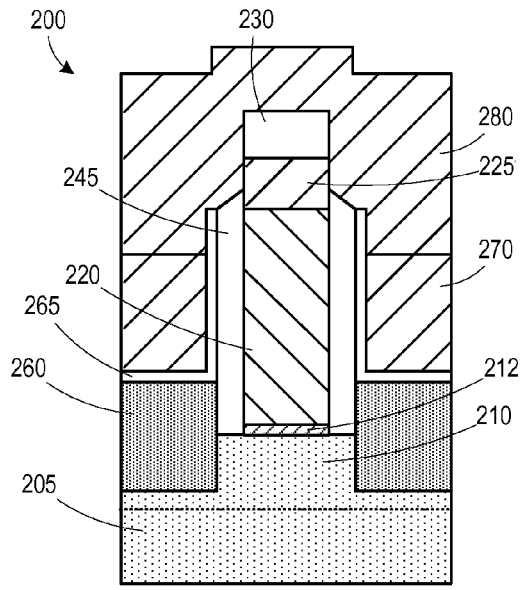
Figure 2N:
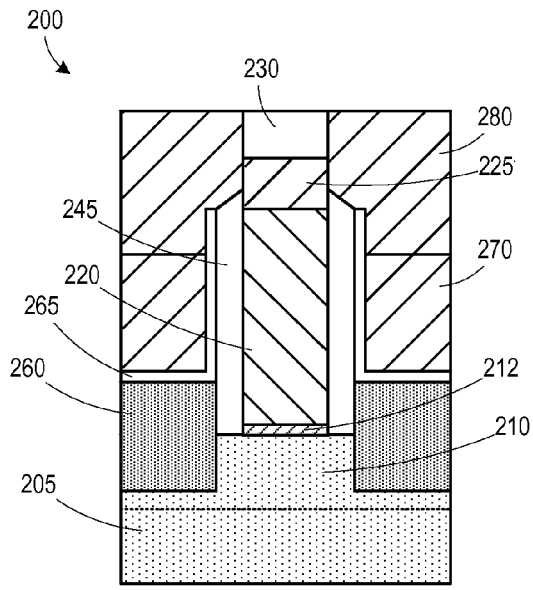
Figure 2O:
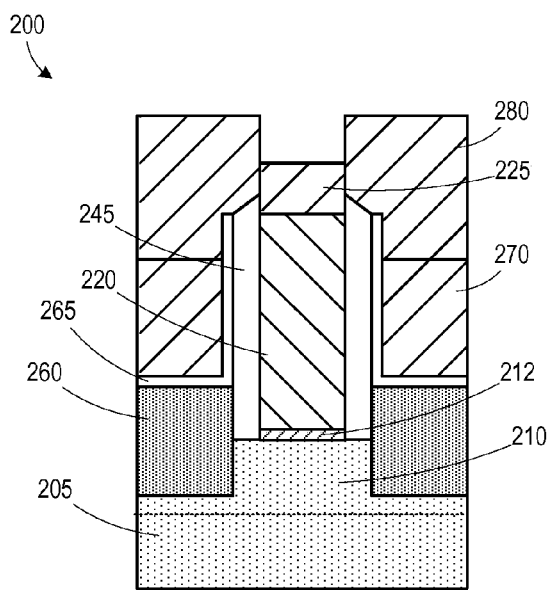
Figure 2P:
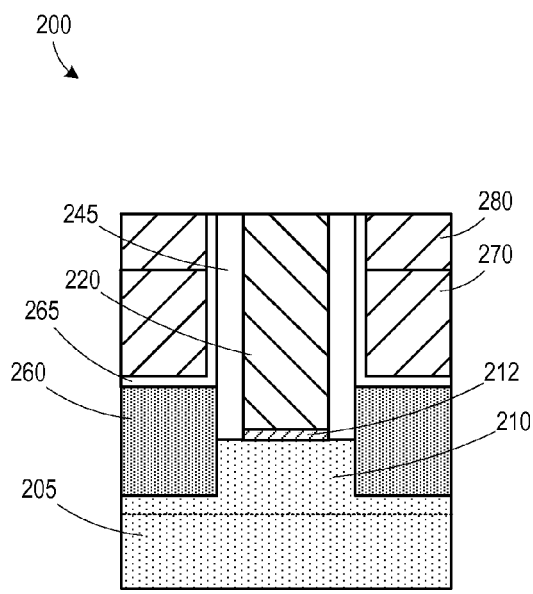
Figure 2Q:
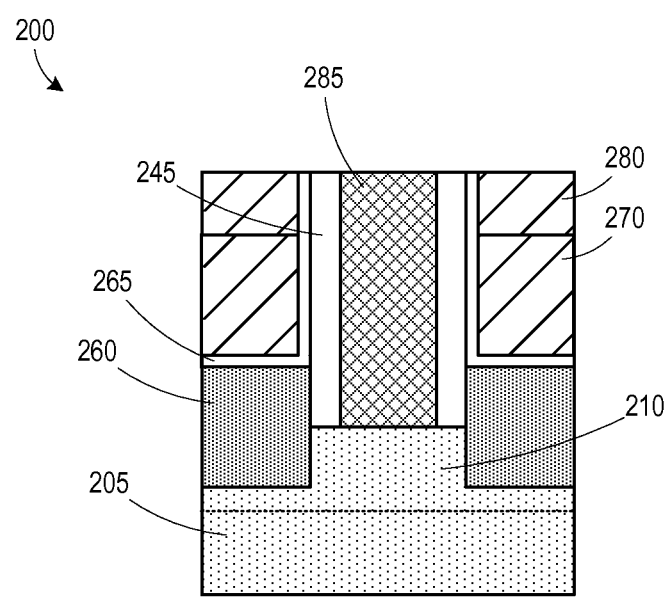

FIGS. 2A-2Q illustrate various methods for forming a fin-FET device 200. Although the techniques are illustrated for the formation of a finFET device, they may also be applied to planar transistor devices. FIGS. 2A-2Q show a cross-sectional view (in the gate length direction of the device 200, i.e., in the direction of current flow when the device is operational) of a substrate 205 with a fin 210 defined therein. A plurality of layers 215 is formed above the fin 210 for forming a placeholder gate structure. The plurality of layers 215 includes a gate insulation layer 212, a placeholder material layer 220 (e.g., polysilicon), a first hard mask layer 225 (e.g., silicon dioxide) and a second hard mask layer 230 (e.g., silicon nitride). In general, the first and second hard mask layers 225, 230 may be etched selectively to one another. In some embodiments, additional layers may be provided in the gate stack 215. A patterned photoresist layer 235 is formed above the plurality of layers 215.

The finFET device 200 depicted herein may be employed to define either NMOS or PMOS transistors. Additionally, various doped regions, e.g., halo implant regions, well regions and the like, may be formed, but are not depicted in the attached drawings. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semi-conductor devices are formed in and above the active layer. The substrate 205 and/or the fin 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers. For example, the fins 210 may be formed in a process layer formed above the base layer of the substrate 205.

FIG. 2B illustrates the finFET device 200 after performing an anisotropic etch process to pattern the various material layers and thereby define the gate stack 215 and performing an ashing process to remove the patterned photoresist layer 235.

FIG. 2C illustrates the finFET device 200 after performing a deposition process to form a spacer layer 240 (e.g., silicon nitride), and FIG. 2D illustrates the finFET device 200 after performing an anisotropic etch process to pattern the spacer layer 240 to define sidewall spacers 245. The first and second hard mask layers 225, 230 collectively define a cap structure 250 above the placeholder material 220.

FIG. 2E illustrates the finFET device 200 after performing a plurality of processes operations to recess the fin 210 and grow epitaxial semiconductor material 260 that define the source/drain regions of the finFET device 200. In the case of a P-type transistor device, the epitaxial semiconductor material 260 may be silicon germanium, while in the case of an N-type transistor device, the epitaxial semiconductor material 260 may be silicon, silicon phosphorous, or silicon carbon, for example.

FIG. 2F illustrates the finFET device 200 after performing a conformal deposition process to form an etch stop layer 265 (e.g., silicon nitride) above the cap structure 250 and the epitaxial semiconductor material 260. The etch stop layer 265 protects the epitaxial semiconductor material 260 during a subsequent process to form a different epitaxial semiconductor material (not shown) on fins of a device that is of a different conductivity type.

Figure 1B:
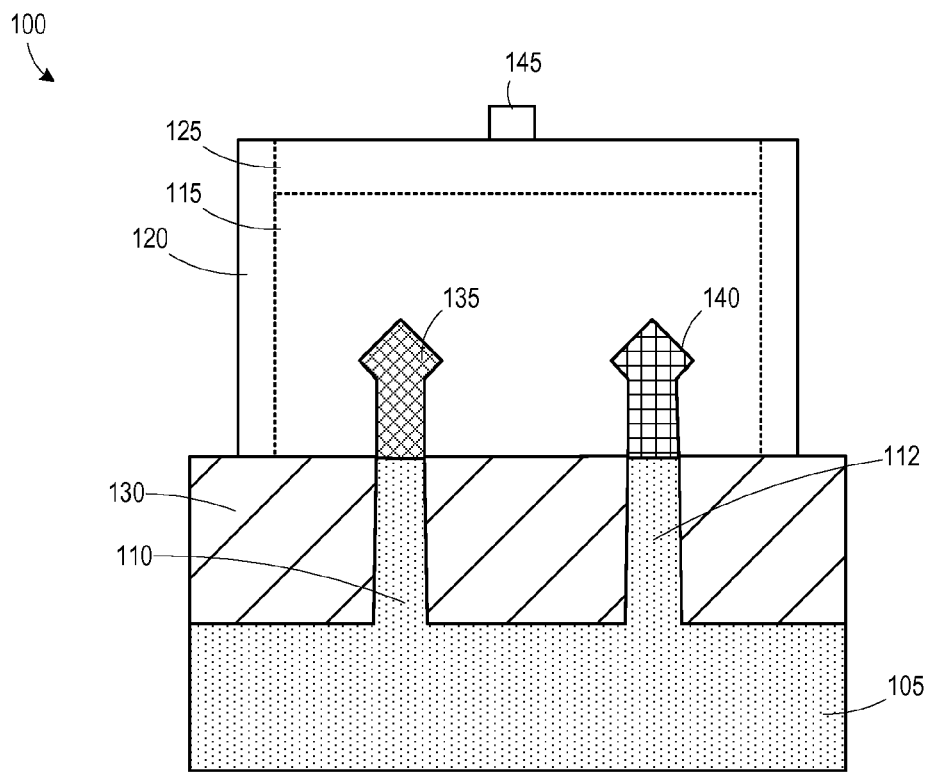
Figure 1C:
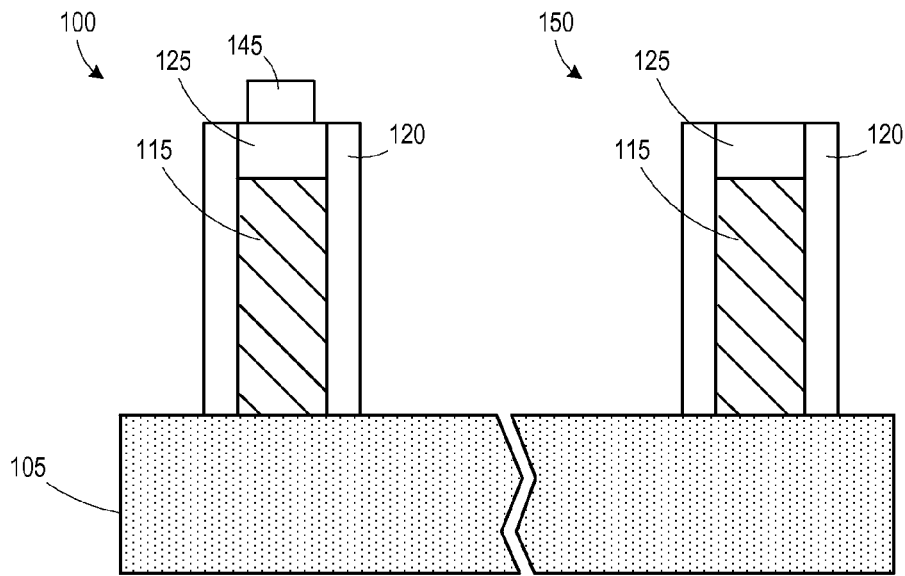
Figure 1D:
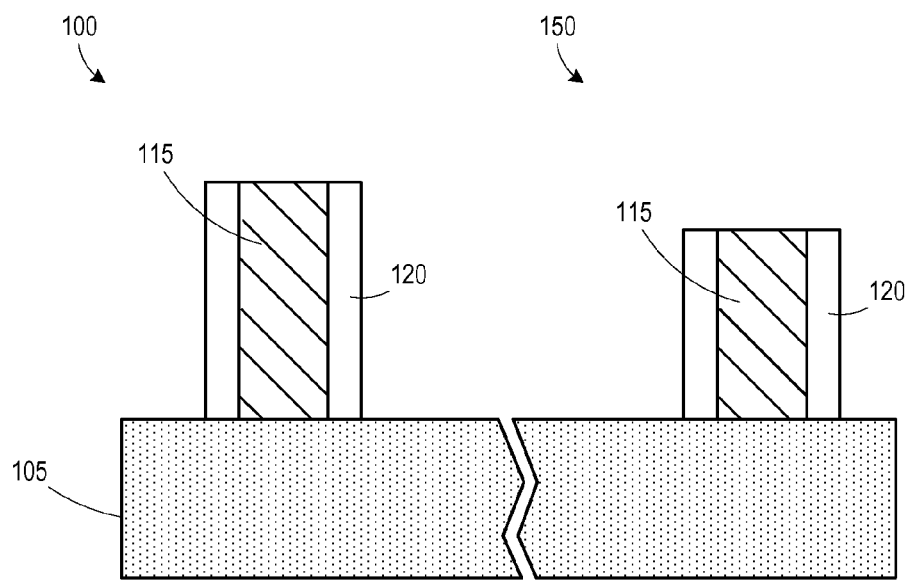

FIG. 2G illustrates a cross-section view of the finFET device 200 in a region between fins where the overlapping masks (e.g., including the etch stop layer 265) used to mask different devices when forming different epitaxial semiconductor materials on the fins of devices of different conductivity types causes the formation of a bump feature 267 above the cap structure 250. Since the overlap region is generally above the gate structure in an area between fins, the bump feature 267 is not visible in the cross-section of FIG. 2F. Generally, the bump feature 267 includes additional hard mask material (e.g., silicon nitride), as illustrated in the prior art device of FIG. 1B. In a planar transistor device, bump features are also present above the gate electrode when different epitaxial semiconductor regions are formed for transistor devices with a shared gate electrode.

FIG. 2H illustrates the finFET device 200 after performing a deposition process to deposit a first interlayer dielectric layer (ILD) 270 (e.g., a low-k dielectric material) above the etch stop layer 265 and performing a planarization process on the first ILD layer 270 to expose the top surface of the etch stop layer 265 disposed above the cap structure 250. In the region where the bump feature 267 is present, the planarizing process exposes the top surface of the bump feature 267. FIG. 2I illustrates the finFET device 200 after performing an etch process to recess the ILD layer 270.

FIG. 2J illustrates the finFET device 200 after performing an oxidation process that oxidizes portions of the etch stop layer 265, the sidewall spacers 245, and a top portion of the second hard mask layer 230 to define an oxidized region 275. An example oxidation process includes exposing the substrate 205 to an oxygen-containing ambient during a heating process. The oxygen is incorporated into the silicon nitride material, e.g., the etch stop layer 265, the sidewall spacers 245, and a top portion of the second hard mask layer 230, changing those materials to silicon oxy-nitride. As shown in FIG. 2K, the additional hard mask material from the bump feature 267 (e.g., silicon nitride) formed above the gate structure 255 from overlapping masks used to form the epitaxial semiconductor material 260 and other epitaxial semiconductor material (not shown) is also oxidized.

FIG. 2L illustrates the finFET device 200 after performing an isotropic etch process to remove the oxidized region 275 and expose the remaining portion of the hard mask layer 230. FIG. 2M illustrates the finFET device 200 after performing a deposition process to form a second ILD layer 280. The first and second ILD layers 270, 280 may be the same material.

FIG. 2N illustrates the finFET device 200 after performing a planarization process to expose the second hard mask layer 230, and FIG. 2O illustrates the finFET device 200 after performing an etch process to remove the second hard mask layer 230. FIG. 2P illustrates the finFET device 200 after performing a planarization process on the ILD layer 280 to expose the placeholder material 220.

FIG. 2Q illustrates the finFET device 200 after performing a plurality of processes to remove the placeholder material 220 and form a replacement gate structure 285 in its place. The processes may include an isotropic etch process to remove the placeholder material(s) 220 and one or more deposition processes to form a gate insulation layer and one or more metal layers that will be part of the replacement gate structure 285. The replacement gate structure 285 may include a gate insulation layer (not separately shown), one or more barrier layers (not separately shown) and a metal fill material (not separately shown).

Because any bump structures 267 that were generated during the formation of the epitaxial regions 260 were previously oxidized and removed prior to performing the planarization process to expose the placeholder material 220, the final height of the replacement gate structure 285 is not affected by the bump density, and the placeholder material 220 is exposed with increased reliability, thereby reducing defects.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a placeholder gate structure above a substrate, said placeholder gate structure comprising a placeholder material and a cap structure defined on a top surface of said placeholder material, said cap structure comprising a first cap layer disposed above said placeholder material and a second cap layer disposed above said first cap layer;
   performing an oxidization process on at least a portion of said second cap layer to form an oxidized region in said second cap layer;
   removing at least a portion of said oxidized region of said second cap layer to expose a remaining portion of said second cap layer;
   removing said remaining portion of said second cap layer;
   removing said first cap layer to expose said placeholder material; and
   replacing said placeholder material with a replacement gate structure.

2. The method of claim 1, further comprising forming a first interlayer dielectric layer covering a first portion of said placeholder gate structure and exposing a second portion of said placeholder gate structure prior to performing said oxidation process, said second portion of said placeholder gate structure including said cap structure.

3. The method of claim 2, further comprising:
   forming a second interlayer dielectric layer above said first interlayer dielectric layer and above said cap structure after removing said portion of said oxidized region; and
   planarizing said second interlayer dielectric layer to expose said remaining portion of said second cap layer.

4. The method of claim 3, further comprising planarizing said second interlayer dielectric layer after removing said remaining portion of said second cap layer to expose said placeholder material.

5. The method of claim 2, wherein said placeholder gate structure further comprises sidewall spacers disposed on sidewalls of said placeholder material, wherein said sidewall spacers are formed prior to forming said first interlayer dielectric layer, performing said oxidation process further comprises oxidizing portions of said sidewall spacers in said second portion of said placeholder gate structure, and the method further comprises removing said oxidized portions of said sidewall spacers.

6. The method of claim 1, further comprising:
   forming an epitaxial material on a portion of said substrate; and
   forming an etch stop layer above said epitaxial material and above said placeholder gate structure, a portion of said etch stop layer defining a bump structure above said second cap layer, wherein said performing said oxidation process further comprises oxidizing said bump structure and said portion of said second cap layer to form said oxidized region.

7. The method of claim 6, further comprising recessing said substrate prior to forming said epitaxial material.

8. The method of claim 1, wherein said forming said placeholder gate structure comprises:
   forming a placeholder material layer above said substrate;
   forming said first cap later above said placeholder material layer;
   forming said second cap layer above said first cap layer; and
   patterning said placeholder material layer, said first cap layer and said second cap layer to define said placeholder gate structure.

9. The method of claim 8, further comprising forming sidewall spacers on sidewalls of said placeholder material.

10. The method of claim 1, wherein said first cap layer comprises an oxide and said second cap layer comprises a nitride.

11. The method of claim 10, wherein said substrate comprises a fin, and said placeholder gate structure is formed above said fin and said substrate.

12. A method, comprising:
    forming a placeholder material layer above a substrate;
    forming a first cap later above said placeholder material layer;
    forming a second cap layer above said first cap layer;
    patterning said placeholder material layer, said first cap layer and said second cap layer to define a placeholder gate structure;
    performing an oxidization process on at least a portion of said second cap layer to form an oxidized region in said second cap layer;
    removing at least a portion of said oxidized region of said second cap layer to expose a remaining portion of said second cap layer;
    removing said remaining portion of said second cap layer selectively to said first cap layer;
    removing said first cap layer to expose said placeholder material; and
    replacing said placeholder material with a conductive material.

13. The method of claim 12, further comprising forming a gate insulation layer beneath said conductive material.

14. The method of claim 12, further comprising:
    forming an epitaxial material on a portion of said substrate; and
    forming an etch stop layer above said epitaxial material and above said placeholder gate structure, a portion of said etch stop layer defining a bump structure above said second cap layer, wherein said performing said oxidation process further comprises oxidizing said bump structure and said portion of said second cap layer to form said oxidized region.

15. The method of claim 14, further comprising recessing said substrate prior to forming said epitaxial material.

16. The method of claim 12, wherein said first cap layer comprises an oxide and said second cap layer comprises a nitride.

17. The method of claim 12, wherein said substrate comprises a fin, and said placeholder material is formed above said fin and said substrate.

18. A method, comprising:
    forming at least one fin in a semiconductor substrate;
    forming a placeholder gate structure above said at least one fin, said placeholder gate structure comprising a placeholder material and a cap structure defined on a top surface of said placeholder material, said cap structure comprising a first cap layer disposed above said placeholder material and a second cap layer disposed above said first cap layer;
    forming a first interlayer dielectric layer covering a first portion of said placeholder gate structure and exposing a second portion of said placeholder gate structure, said second portion of said placeholder gate structure including said cap structure;

performing an oxidization process on at least a portion of said second cap layer to form an oxidized region in said second cap layer;

removing a portion of said oxidized region of said second cap layer to expose a remaining portion of said second cap layer;

forming a second interlayer dielectric layer above said first interlayer dielectric layer and above said cap structure;

planarizing said second interlayer dielectric layer to expose said remaining portion of said second cap layer;

removing said remaining portion of said second cap layer;

planarizing said second interlayer dielectric layer to remove said first cap layer and expose said placeholder material; and replacing said placeholder material with a conductive material.

19. The method of claim 18, further comprising:

forming an epitaxial material on a portion of said at least one fin; and forming an etch stop layer above said epitaxial material and above said placeholder gate structure, a portion of said etch stop layer defining a bump structure above said second cap layer, wherein said performing said oxidation process further comprises oxidizing said bump structure and said portion of said second cap layer to form said oxidized region.

20. The method of claim 19, further comprising recessing said at least one fin prior to forming said epitaxial material.

21. The method of claim 18, wherein said first cap layer comprises an oxide and said second cap layer comprises a nitride.

* * * * *